(12) United States Patent
Howells

(10) Patent No.: US 6,243,209 B1
(45) Date of Patent: Jun. 5, 2001

(54) METHOD AND APPARATUS FOR PROVIDING RECTANGULAR SHAPE ARRAY OF LIGHT BEAMS

(75) Inventor: Samuel C. Howells, Beaverton, OR (US)

(73) Assignee: Etec Systems, Inc., Hayward, CA (US)

( * ) Notice: Subject to any disclaimer, the term of this patent is extended or adjusted under 35 U.S.C. 154(b) by 0 days.

(21) Appl. No.: 09/315,780

(22) Filed: May 20, 1999

(51) Int. Cl.[7] .............................. G02B 27/14; G02B 5/08
(52) U.S. Cl. ...................... 359/636; 359/629; 359/839; 359/850
(58) Field of Search ........................ 359/839, 840, 359/850, 851, 852, 855, 856, 857, 861, 636, 629

(56) References Cited

U.S. PATENT DOCUMENTS

| | | | |
|---|---|---|---|
| 4,528,452 | 7/1985 | Livesay | 250/491 |
| 4,797,696 | * 1/1989 | Allen et al. | 396/548 |
| 4,871,919 | 10/1989 | Donohue et al. | 250/491.1 |
| 5,646,786 | 7/1997 | Kurtz et al. | 359/637 |
| 5,999,320 | 12/1999 | Shirasaki | 359/577 |

FOREIGN PATENT DOCUMENTS 19830198    2/1999    (DE) .

OTHER PUBLICATIONS

PCT International Search Report & Transmittal PCT/US00/13977 Sep. 6, 2000.

* cited by examiner

Primary Examiner—Georgia Epps
Assistant Examiner—David N. Spector
(74) Attorney, Agent, or Firm—Greg Leitich

(57) ABSTRACT

A linear array of equal intensity optical beams is transformed into a rectangular array of equal intensity optical beams, while the intensity of each beam is kept nearly constant. The transformation is performed using an optical element which has two coatings on the front surface and a reflective coating on the opposing back surface. The front surface is partially coated with a reflective coating and partially coated with an anti-reflective coating. The beams are incident upon the front surface, with some of the beams incident on each of the two different coatings on the front surface. The beams incident on the front surface are specularly reflected. The remaining beams are transmitted through the optical element to the back surface, reflected from the back surface, and transmitted back up through the optical element and exit from the front surface. The exiting beams are thus shifted laterally and transversely to define the desired rectangular array. The index of refraction, thickness of the optical element and the incident angle of the beam as are selected to achieve the desired arrangement of beams.

18 Claims, 3 Drawing Sheets

○ POSITION OF BEAM AT 0% REFLECTIVITY TOP SURFACE
⊘ POSITION OF BEAM AT 100% REFLECTIVITY TOP SURFACE
⊗ POSITION OF BEAM AT 100% REFLECTIVITY BACK SURFACE

METHOD AND APPARATUS FOR PROVIDING RECTANGULAR SHAPE ARRAY OF LIGHT BEAMS

FIELD OF THE INVENTION

This invention pertains to optics and more specifically to an optical arrangement suitable for beam scanning lithography.

BACKGROUND

Beam scanning lithography is a well-known field, see for instance Allen, U.S. Pat. No. 5,255,051 and Allen et al., U.S. Pat. Nos. 5,327,338 and 5,386,221, describing systems which use an array of light beams (typically laser beams) and an optical system involving reflective optics for imaging a pattern onto a substrate. A typical application is for generating patterns for use in semiconductor lithography. The array of light beams is scanned across a substrate in a controlled fashion with the beams being turned on and off in order to expose a photosensitive resist on a surface of the substrate. The exposed areas are then developed, defining a pattern in the resist which is later used for other steps such as etching, etc. Such lithography machines typically use an array of laser beams often referred to as a "brush" with a number of very small diameter laser beams arranged in a line or an m×n array where m and n are integers each greater than or equal to one.

Typically the light beams are independently modulated, that is turned on or off or modulated between being on and off and so having a gray scale level of intensity. There are also known systems using light beams in which the light beams, instead of being incident on a semiconductor wafer, are incident on a semiconductor which is a photocathode. The incident light beams generate electrons ejected from the photocathode which in turn form an electron beam which in turn is used to define a pattern on, for instance, a sensitive substrate.

It is well known to provide a linear array of laser beams from a single laser; see Allen, U.S. Pat. No. 4,797,696, incorporated herein by reference in its entirety. For many types of pattern generating systems, rather than a single linear array of beams it is desirable to have a rectangular m×n array. This array is called rectangular because the beams are arranged in a shape which is rectangular in a plane perpendicular to the axis of the beams. Each individual beam in cross-section is typically circular, although this is of no particular importance to this disclosure.

It would be desirable therefore to find a simple and efficient (lossless) way to transform such an initial linear array of equal intensity light beams, for instance laser beams, into a rectangular shaped array of equal intensity beams. It is important that the transformation be essentially lossless so that the full intensity of each individual beam is preserved but it is moved, in terms of location, relative to other of the beams. It is also important that the pitch (the spacing between beam centers) be precise for accurate lithography.

SUMMARY

In accordance with this invention, a linear array of equal intensity optical beams is transformed into a rectangular array with the same number of optical beams, while keeping the intensity of each beam essentially constant. Thus an m×n array of beams is converted into an $$\frac{m}{2} \times 2n$$

array where m is an even integer and n is an integer, as described above. The basic optical component which performs this conversion is a body of material transmissive to the beams, for instance fused silica or glass, in the form of a plate having two principal parallel surfaces and a particular thickness. The front surface of the plate is partially coated with a reflective coating. The remainder of the front surface is not so coated but instead has an anti-reflective coating, thus making this portion of the front surface transmissive. The opposite surface of the plate has a reflective coating which covers that entire opposite surface.

The incident laser beams are directed from their source onto the front surface of the plate so that approximately half of them fall on the reflective portion and the remainder fall on the non-reflective portion. Obviously, the beams that fall on the reflective portion are reflected back at an angle of reflection equal to the angle of incidence. (It is to be understood that typically the angle of incidence is not 90° but it is a predetermined angle selected to achieve the purposes in accordance with this invention.) The remainder of the beams is transmitted through the anti-reflective coating and through the plate and reflects off the opposite (back) surface of the plate. These beams then are transmitted back through the plate and back out through another portion of the front surface anti-reflective coating to the exterior. The index of refraction of the plate, the thickness of the plate, and the angle of incidence of the beams on the plate are selected so that when these beams which reflect from the back surface return to the front surface they are shifted by exactly the right number of beam spacings laterally and by one beam spacing transversely. (Beam spacing refers to the center-to-center distance between adjacent beams in the array.) Thus the plate is positioned so that the beams which are incident on its back surface strike a region of the front surface that is anti-reflective coated and thereby exit the plate. After leaving the plate the two sets of beams are traveling in the same direction with the desired beam spacing and all beams are in parallel.

Several such optical elements (plates) may be arranged in series. By using for instance two such optical elements arranged in series and properly located, an initial array of, e.g., thirty-two beams by one beam is converted into a rectangular array of eight beams by four beams.

BRIEF DESCRIPTION OF THE DRAWINGS

Similar reference numbers in various of the figures refer to similar or indentical structures.

DETAILED DESCRIPTION

Figure 1A:
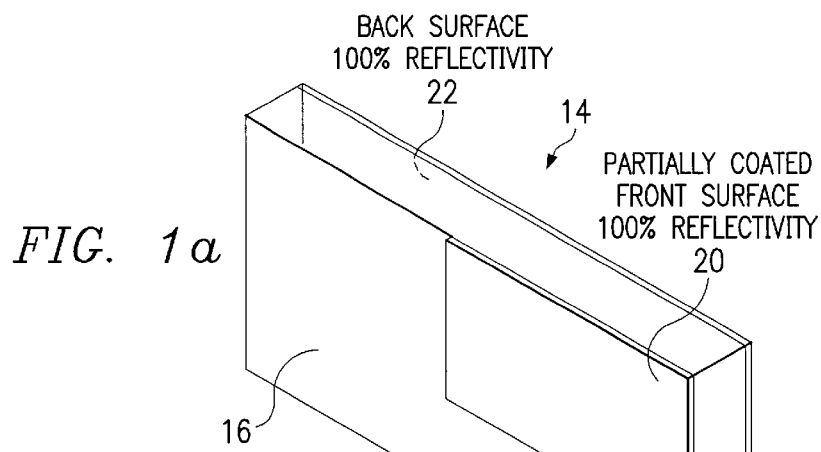
FIGS. 1a, 1b, 1c, and 1d respectively show perspective, front, end and back views of an optical element in accordance with this invention.
Figure 1B:
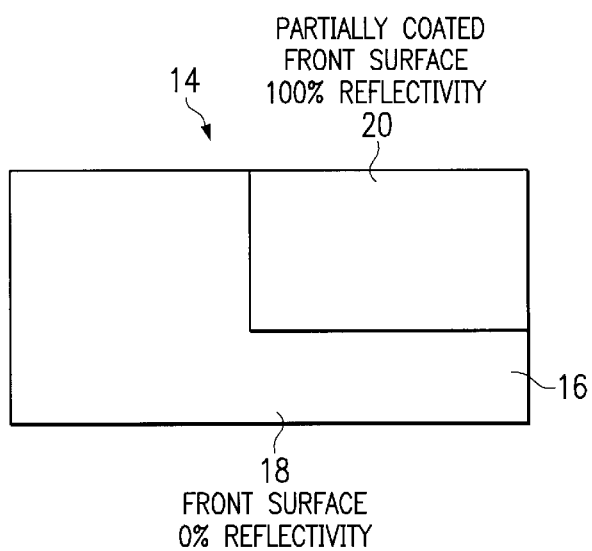
Figure 1C:
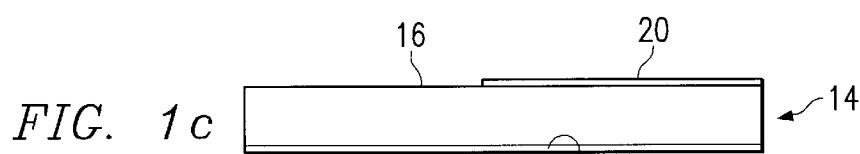
Figure 1D:
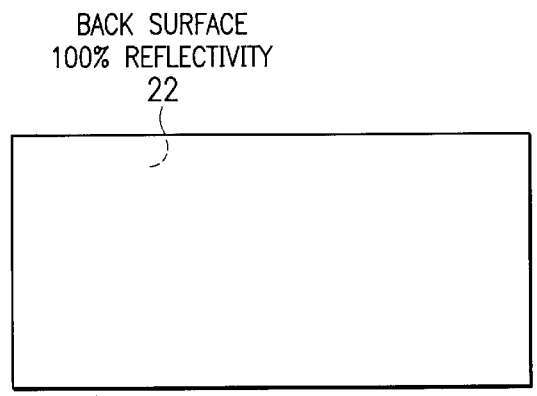

FIG. 1a shows a perspective view of an optical element 14 (a plate) in accordance with this invention. It is fabricated of a conventional optical material, such as fused silica, that has the desired optical properties. These optical properties are chosen, as described below, to be consistent with the wavelengths of the incident light beams. For instance, if the incident light beams are in the ultraviolet, the optical material is compatible with ultraviolet radiation in terms of its desired index of refraction and robustness to UV exposure. The chosen optical material is one which is essentially transmissive to the incident light beams. FIGS. 1b, 1c and 1d show respectively front, end and back views of optical element 14. Optical element 14 has two principal planar surfaces which are fabricated to be as parallel (to one another) and planar as possible. The front (top) surface 16 is partially coated with an anti-reflective coating (this coating may be omitted if the optical material itself is sufficiently non-reflective). The portion of the front surface 16 which is coated with the anti-reflective coating is designated 18. The remaining portion 20 of the front surface 16 is coated with a reflective coating. Coating 20 is reflective.

While a rectangular area of coating 20 is depicted, this is not limiting but is shown for purposes of simplicity. The actual shape of the area of coating 20 is determined by the optical arrangement described hereinafter. A variety of suitable reflective coating and anti-reflective coatings are commercially available, dependent upon the wavelength of the incident light beams. The bottom (back) surface 22 of element 14 is completely coated with a reflective coating.

Figure 2:
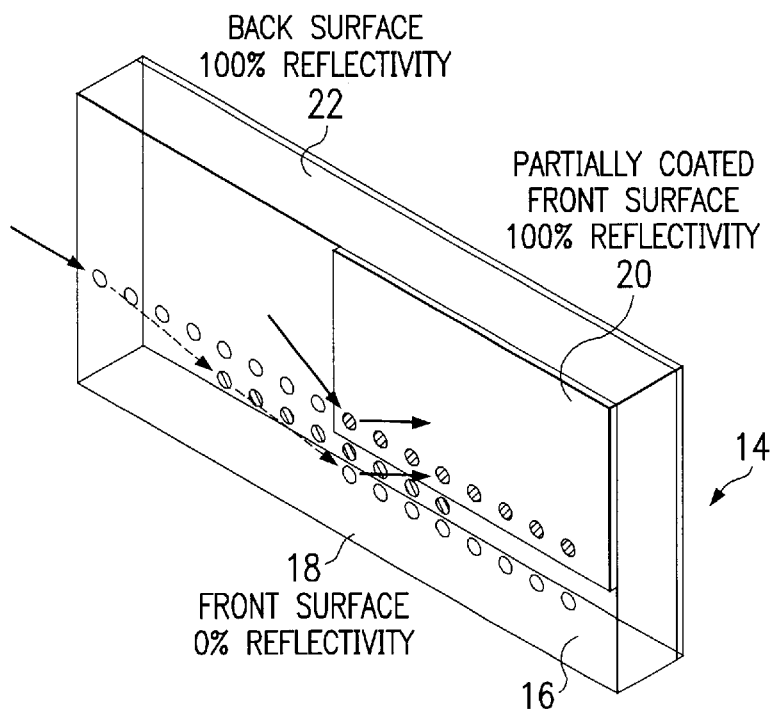
FIG. 2 shows the beams incident on and exiting from the optical element of FIG. 1.

The reasons for this are understood with regard to FIG. 2 which depicts the same element 14 with the same surfaces identically labeled as in FIG. 1a and also depicts, in the form of small circles, the cross-sections of the light beams. The key at the bottom of FIG. 2 designates the light beams. In this case, the incident linear array of light beams consists of sixteen beams equally spaced apart. The circles in FIG. 2 only indicate the cross-section of the beams, since this is a top view. The source of the beams and associated optics, which are conventional, are not depicted for purposes of simplicity. As shown, eight of the beams are incident upon the area of coating 18 and eight others are incident upon the area of coating 20 of optical element 14. Those eight beams incident upon area 20 are reflected back. The remaining eight beams pass through the anti-reflective coating 18 to the bottom surface 22, where they are shown by the gray circles.

It is to be understood that these beams are somewhat translated (by refraction) from their position on the front surface 16 since the beams are incident at an angle, as depicted by the arrows. These eight beams therefore pass through the front surface 16 and travel to the back surface 22 from which they are reflected by the reflective coating present on back surface 22. By choosing the angle of incidence (depicted later) and plate thickness properly, when the beams reach the back surface 22 they are shifted laterally, in this case by four beam spacings, and transversely, by one-half of a beam spacing. Upon reaching the back surface 22 they are reflected from the reflective coating present there and travel back to the front surface 16. At the front surface 16 they are shifted by exactly eight beam spacings laterally and one beam spacing transversely as shown in FIG. 2. The optical element (plate) 14 is positioned so that the eight beams that are transmitted to the back surface 22 are incident on the region of the front surface that also has anti-reflective coating 18 and therefore exit the plate 14. After exiting the plate 14, the two sets of beams are again traveling in the same direction parallel with the same spacing as when they were incident but now arranged, instead of in a 16×1 array, in an 8×2 array.

As understood by one of ordinary skill in the art, key factors here are the thickness of the plate 14, the refractive index of the plate 14 material, and the angle of incidence of the beams onto the plate 14.

Figure 3A:
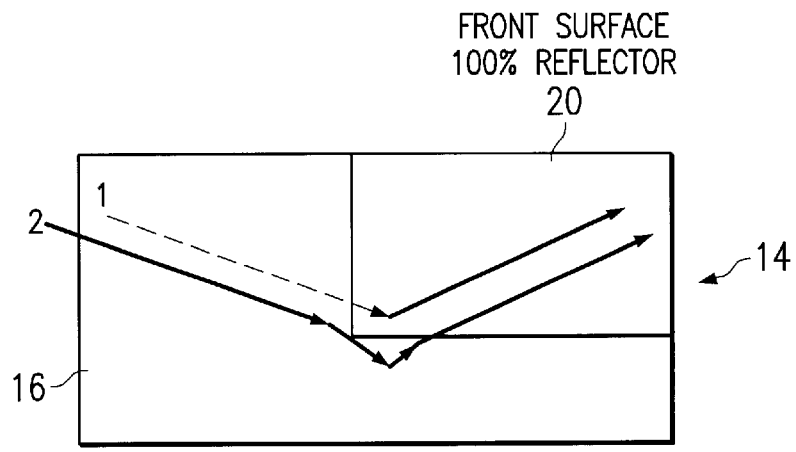
FIGS. 3a, 3b and 3c show particular beams of FIG. 2 in respectively top, end and side views.
Figure 3B:
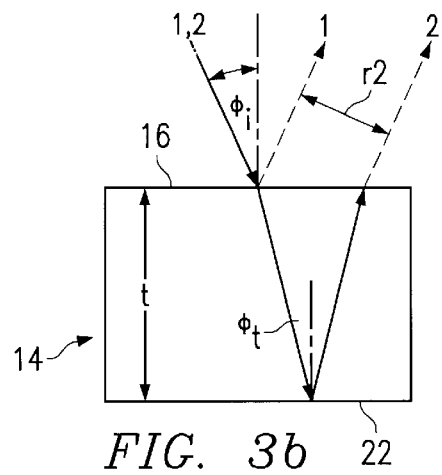
Figure 3C:
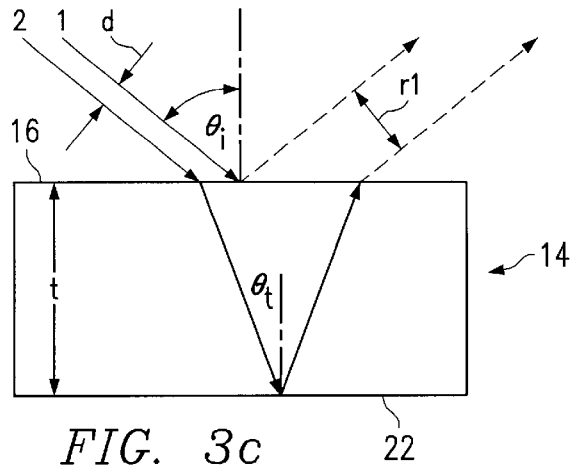

These parameters are depicted in FIGS. 3a, 3b and 3c which respectively show a top view, an end view and a side view of the FIG. 2 structure with similar elements identically labeled. The dark arrows in FIGS. 3a, 3b and 3c correspond to those in FIG. 2 in showing the axis of the beams. For purpose of simplicity, only two beams are shown in FIGS. 3a, 3b and 3c as being the incident beams so this is a 2×1 beam array. As shown in FIGS. 3b and 3c the thickness of the plate 14 is t and the initial spacing between beams (center-to-center) is distance d.

The actual design of the system depends on the geometries shown in FIGS. 3a, 3b and 3c as follows. Assume that the two beams 1, 2 shown in FIG. 3a are traveling co-linearly (in parallel) but separated by distance d measured perpendicular to their propagation direction. Beams 1, 2 strike the plane parallel plate 14 having thickness t (and refractive index n) at a compound angle defined by $\theta_i$ and $\phi_i$ as shown in respectively FIGS. 3b and 3c. The compound angle is important for operation of this device and is defined by the angles respectively $\phi_i$ and $\theta_i$ in two orthogonal planes both of which are also at right angle to the plane defined by the upper surface of plate 14.

The angle $\theta_i$ is measured in the plane defined by the line connecting the beam rays and the surface normal (the dotted line) and gives the angle of incidence in this plane. The angle $\phi_i$ is measured in a plane perpendicular to the plane containing angle $\theta_1$ and parallel to the surface normal. Again, $\phi_i$ gives the angle of incidence in this plane. Hence $\phi_i$, $\theta_i$ define the compound angle.

Beams 1, 2 are arranged so that beam 1 is incident on area 20 that has been reflectively coated while the beam 2 is incident on the area 18 that has the anti-reflection coating (or perhaps no coating) but which in any case is non-reflective. Beam 1 thus reflects from the front surface of the plate 14 at angle $\theta_i$ and beam 2 refracts through the plate 14 and travels to the back surface 22 of the plate 14. Since the back surface 22 of the plate is coated with reflective material over its entire face, beam 2 reflects therefrom and travels back to the front surface 16 as depicted. Because the plate 14 has the anti-reflection coating 18 at the point where beam 2 strikes the front surface 16, this beam exits plate 14 and again travels co-linearly with beam 1.

Beam 2 is shifted with respect to beam 1. The shifted beam distance is the distance r1 between beam 1 and beam 2 measured in a plane containing angle $\phi_i$ and perpendicular to beam 1 (parallel to the brush.) The equation for distance r1 is:

$$r1 = -d + (2 \cdot t \cdot \tan\theta_i \cdot \cos\theta_i)/(n^2 - \sin^2\theta_i)^{1/2}$$

Conversely, the distance r2 from beam 1 to beam 2 is measured in a plane containing angle $\theta_i$ and perpendicular to beam 1 (perpendicular to the brush). The equation for distance R2 is:

$$r2 = (2 \cdot t \cdot \sin\phi_i \cdot \cos\phi_i)/(n^2 - \sin^2\phi_i)^{1/2}$$

Since angles $\theta_i$ and $\phi_i$ can be adjusted independently by tilting plate 14, it is possible to vary the output beam spacing in directions both parallel and perpendicular to the brush independently for a plate of given thickness t.

The analysis of FIGS. 3a, 3b and 3c can be extended to a more typical beam configuration used in laser pattern generators as described above. Typically, instead of only the two beams there are instead, e.g., eight beams or more traveling parallel on a single plane (separated by at diameters). By properly selecting the angles $\theta_i$ and $\phi_i$, the spacing between beams both in a direction parallel to the brush and perpendicular to the brush can be made identical. As an example, for a thirty-two beam brush with beam-to-beam spacing of 0.5 mm, where the plate 14 has a refractive index of 1.5 and the angle incidence 45°, an evenly spaced array can be obtained by choosing t=10.583 mm and $\phi_i$=2.0314°. Of course, this is merely illustrative. (Note that the refractive index is of course the refractive index at the wavelength of the incident beams.)

Figure 4A:
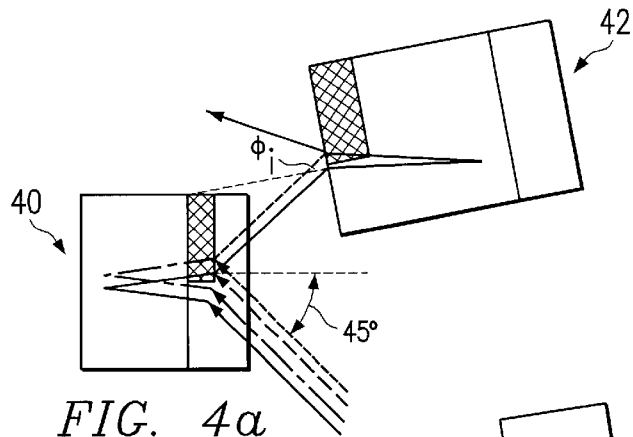
FIGS. 4a and 4b show respectively top and side views of a series of optical elements of the type of FIG. 1 with corresponding beam rays.
Figure 4B:
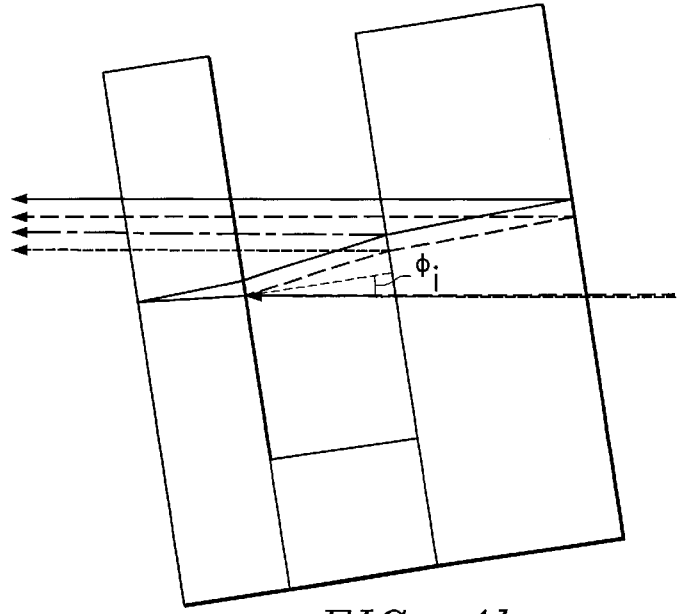

It is readily understood as described above that the process described above can be repeated by using a second somewhat similar plate to convert the resulting 2×16 rectangular beam array into a 4×8 rectangular beam array. The second conversion requires a second plate of different thickness and/or beam incident angles. This two-plate arrangement is depicted in respectively a plan (top) view and side view in FIGS. 4a and 4b. Thus using the output of the first plate 40 (which is the same as plate 14 in FIGS. 3a, 3b and 3c), a 2×8 rectangular beam array with the beams separated array with the beams separated by 0.5 mm in both horizontal and vertical directions and choosing $\phi_i$ equals −2.0314° forces the thickness of the second plate 42 to be 21.166 mm and the incident angle $\theta_i$ to be 8.1955°. Since the process of shifting the beam locations in accordance with this invention is largely lossless (being essentially reflective), one may extend this and have more than two such optical elements in series to further manipulate the beam array.

This disclosure is illustrative and not limiting; further modifications will be apparent to one skilled in the art in light of this disclosure and are intended to fall within the scope of the appended claims.

I claim:

1. An optical element comprising:
   a body of optically transmissive material having two parallel principal and opposing surfaces;
   a first of the surfaces being substantially 100% reflective; the second of the surfaces having a first portion which is substantially 100% reflective and second portion which is anti-reflective.

2. The optical element of claim 1, wherein a spacing between the two surfaces and a refractive index of the material is such that a light beam incident on the second portion of the second surface at a predetermined angle to a normal to a plane defined by the second surface is refracted by the body, reflects off the first surface back through the body, and passes through the second portion of the second surface to the exterior of the body, is shifted laterally and transversely with regard to a second beam incident on the first portion and spaced apart from and co-linear to the incident first beam.

3. The optical element of claim 2, wherein the spacing between the two surfaces is t and the refractive index is n, and the incident first beam is spaced apart from the incident second beam by a distance d, and the predetermined angle of only the second beam is $\Theta$ and wherein the first beam is shifted by distance r1, where:

$$r1=(2t\sin\Theta\cos\Theta)/(n^2-\sin^2\Theta)^{1/2}$$

4. The optical element of claim 2, wherein the spacing between the two surfaces t, the refractive index is n, and both beams are incident on the second surface at angle $\phi$, where the second beam is shifted by distance r2 where $$r2=(2\cdot t\cdot\sin\phi\cdot\cos\phi)/(n^2-\sin^2\phi)^{1/2}$$

5. A method comprising:
   providing at least one linear array of light beams;
   directing at least some of the beams through a first surface of a body to an opposing reflective surface of the body and reflecting the beams back through the body to an exterior thereof;
   directing a remaining number of the beams onto a reflective portion of the first surface of the body, wherein the beams directed through the body are shifted transversely with regard to the remaining number of the beams.

6. The method of claim 5, wherein a spacing between the opposing surfaces of the body and a refractive index of the body is such that a light beam directed through the body is incident on the body at a predetermined angle to a normal to a plane defined by the first surface is refracted by the body, reflects off the opposing surface back through the body, and passes through the first surface to the exterior of the body, is shifted laterally and transversely with regard to a second beam incident on the first surface and spaced apart from and co-linear to the incident first beam.

7. The method of claim 6, wherein the spacing between opposing surfaces of the body is t and the refractive index is n, and the incident first beam is spaced apart from the incident second beam by a distance d, and the predetermined angle of only the second beam is $\theta$, and wherein the first beam is shifted by distance r1, where:

$$r1=2\cdot t\cdot\sin\theta\cdot\cos\theta/(n^2-\sin^2\theta)^{1/2}$$

8. The method of claim 6, wherein the spacing between the opposing surface is t, the refractive index is n, and both beams are incident on the first surface at angle $\phi$ where the second beam is shifted by distance r2 where:

$$r2=2\cdot t\cdot\sin\phi\cdot\cos\phi/(n^2-\sin^2\phi)^{1/2}$$

9. An optical system comprising:
   a source of at least one linear array of light beams;
   an optical element arranged so that the beams are directed onto the optical element, the optical element comprising:
      a body of material optically transmissive of the light beams and having two parallel and opposing principal surfaces, the light beams being incident on a second of the surfaces;
      a first of the surfaces being reflective; and
      a second of the surfaces having a first portion which is reflective and a second portion which is anti-reflective, wherein some of the light beams are incident on the first portion and a remainder of the light beams are incident on the second portion.

10. An optical system in accordance with claim 9, said source comprising a source of a plurality of parallel linear arrays of light beams.

11. A system, comprising:
    at least one brush, said brush comprising at least one linear array of laser beams; and
    an optical system, said optical system adapted to transform said at least one linear array of light beams into at least one rectangular array of an equal number of light beams.

12. A system in accordance with claim 11, wherein at least one laser beam of said at least one linear array is reflected off a first optical surface of said optical system, and at least one laser beam of said at least one linear array is reflected off a second optical surface of said optical system after passing through said first optical surface.

13. A system in accordance with claim 12, wherein said at least one linear array comprises n linear arrays of m laser beams and an output of said optical system comprises 2n linear arrays of m/2 laser beams.

14. A system in accordance with claim 13, wherein said m/2 laser beams of said 2n linear arrays have substantially the same intensity as said m laser beams of said n linear arrays.

15. A method, comprising:
providing at least one brush, said brush comprising at least one linear array of laser beams; and
providing an optical system, said optical system adapted to transform said at least one linear array of light beams into at least one rectangular array of an equal number of light beams.

16. A method in accordance with claim 15, wherein at least one laser beam of said at least one linear array is reflected off a first optical surface of said optical system, and at least one laser beam of said at least one linear array is reflected off a second optical surface of said optical system after passing through said first optical surface.

17. A system in accordance with claim 16, wherein said at least one linear array comprises n linear arrays of m laser beams and an output of said optical system comprises 2n linear arrays of m/2 laser beams.

18. A method in accordance with claim 17, including providing a photosensitive substrate at an output of said optical system.

* * * * *